(12) United States Patent
Tzoufras et al.

(10) Patent No.: US 10,983,883 B2
(45) Date of Patent: Apr. 20, 2021

(54) ERROR RECOVERY IN MAGNETIC RANDOM ACCESS MEMORY AFTER REFLOW SOLDERING

(71) Applicant: SPIN MEMORY, INC., Fremont, CA (US)

(72) Inventors: Michail Tzoufras, Fremont, CA (US); Marcin Gajek, Fremont, CA (US)

(73) Assignee: SPIN MEMORY, INC., Fremont, CA (US)

( * ) Notice: Subject to any disclaimer, the term of this patent is extended or adjusted under 35 U.S.C. 154(b) by 211 days.

(21) Appl. No.: 16/367,058

(22) Filed: Mar. 27, 2019

(65) Prior Publication Data

US 2020/0310930 A1    Oct. 1, 2020

(51) Int. Cl.
| | |
|---|---|
| *G11C 11/20* | (2006.01) |
| *G06F 11/20* | (2006.01) |
| *G06F 11/16* | (2006.01) |
| *G11C 11/16* | (2006.01) |
| *G11C 27/02* | (2006.01) |
| *G11C 11/14* | (2006.01) |
| *G11C 11/15* | (2006.01) |

(52) U.S. Cl.
CPC ...... *G06F 11/2069* (2013.01); *G06F 11/1612* (2013.01); *G11C 11/14* (2013.01); *G11C 11/15* (2013.01); *G11C 11/16* (2013.01); *G11C 11/1673* (2013.01); *G11C 11/1675* (2013.01); *G11C 11/1677* (2013.01); *G11C 27/022* (2013.01); *G11C 2211/00* (2013.01); *G11C 2211/56* (2013.01)

(58) Field of Classification Search
CPC .......... G11C 27/022; G11C 2211/5615; G11C 2211/00; G11C 11/14–11/16
See application file for complete search history.

(56) References Cited

U.S. PATENT DOCUMENTS

| | | | |
|---|---|---|---|
| 8,788,741 B2 | 7/2014 | Kwon et al. | |
| 2011/0078538 A1* | 3/2011 | Ikegawa | G11C 11/1675 714/758 |
| 2012/0204077 A1 | 8/2012 | D'Abreu et al. | |
| 2020/0110891 A1* | 4/2020 | Pope | G06F 21/62 |

* cited by examiner

*Primary Examiner* — Han Yang
(74) *Attorney, Agent, or Firm* — Morgan, Lewis & Bockius LLP

(57) ABSTRACT

A method is performed at an electronic device that includes magnetic random access memory (MRAM). The method includes loading the MRAM with data including main data, first error correcting data, and second error correcting data. The MRAM comprises a plurality of MRAM cells characterized by a first magnetic anisotropy corresponding to a first error rate at a predefined temperature that exceeds a threshold for correcting errors using only the first error correcting data. The method further includes, after loading the MRAM with the data, heating the MRAM to the predefined temperature and correcting errors in the main data using both the first error correcting data and the second error correcting data. The method further includes after correcting the errors in the main data, erasing, from the MRAM, the second error correcting data and maintaining, on the MRAM, the first error correcting data.

13 Claims, 5 Drawing Sheets

200

202 — Load magnetic random access memory (MRAM) with data for an electronic device, including main data, first error correcting data, and second error correcting data.

The MRAM comprises a plurality of MRAM cells characterized by a first magnetic anisotropy corresponding to a first error rate at a predefined temperature.

The first error rate exceeds a threshold for correcting errors using only the first error correcting data.

204 — The main data comprises firmware for the device.

206 — Each of the plurality of the MRAM cells comprises a magnetic storage layer and a magnetic reference layer.

A datum is encoded in a relative alignment of a magnetization of the magnetic storage layer and the magnetic reference layer.

208 — Each of the plurality of the MRAM cells comprises a current-induced magnetic switching device.

210 — The first error rate corresponds to a thermal stability of the relative alignment of the magnetization of the magnetic storage layer and the magnetic reference layer.

212 — After loading the MRAM with the data:

214 — Heat the MRAM to the predefined temperature

216 — The MRAM is heated to the predefined temperature during a reflow soldering process.

ERROR RECOVERY IN MAGNETIC RANDOM ACCESS MEMORY AFTER REFLOW SOLDERING

TECHNICAL FIELD

This relates generally to increasing the robustness of pre-loaded data prior to manufacturing processes at elevated temperatures, and more specifically to error recovery in magnetic random access memory (MRAM) after reflow soldering.

BACKGROUND

Reflow soldering is a process in which a solder paste (e.g., a sticky mixture of powdered solder and flux) is used to temporarily attach one or thousands of tiny electrical components to their contact pads, after which the entire assembly is subjected to controlled heat (e.g., via infrared thermal treatment). The solder paste reflows in a molten state, creating permanent solder joints. Reflow soldering can thus be used, for example, to attach a silicon chip to a printed circuit board or during chip packaging.

In order to keep costs down, manufacturers typically store firmware or other data on chips prior to the attaching the chips to larger devices and/or a packages via reflow soldering. The information stored in memory must therefore be resilient to the harsh thermal treatment of reflow soldering (e.g., 220-260° C. for 3 minutes).

SUMMARY (A1) Embodiments of the present disclosure provide a method for error recovery in magnetic random access memory after reflow soldering. The method is performed at an electronic device that includes magnetic random access memory (MRAM). The method includes loading the MRAM with data including main data, first error correcting data, and second error correcting data. The MRAM comprises a plurality of MRAM cells characterized by a first magnetic anisotropy corresponding to a first error rate at a predefined temperature. The first error rate exceeds a threshold for correcting errors using only the first error correcting data. The method further includes, after loading the MRAM with the data: heating the MRAM to the predefined temperature; and correcting errors in the main data using both the first error correcting data and the second error correcting data. The method further includes, after correcting the errors in the main data: erasing, from the MRAM, the second error correcting data; and maintaining, on the MRAM, the first error correcting data.

(A2) In some embodiments of (A1), the method further includes, after erasing, from the MRAM, the second error correcting data, operating the electronic device; while operating the electronic device, detecting an error in the main data; and correcting the error in the main data using the first error correcting data.

(A3) In some embodiments of any of (A1)-(A2), the MRAM is heated to the predefined temperature during a reflow soldering process.

(A4) In some embodiments of any of (A1)-(A3), the main data comprises firmware for the device.

(A5) In some embodiments of any of (A1)-(A4), the main data is redundantly-encoded in the first error correcting data and the second error correcting data; and correcting errors in the main data using both the first error correcting data and the second error correcting data includes majority voting.

(A6) In some embodiments of any of (A1)-(A4), at least one of the first error correcting data and the second error correcting data comprise error correcting code data; and correcting errors in the main data using both the first error correcting data and the second error correcting data includes using one of a Hamming code and a Bose-Chaudhuri-Hocquenghem (BCH) code.

(A7) In some embodiments of any of (A1)-(A6), the method includes predicting the first error rate based on the predefined temperature; and allocating an amount of second error correcting data based on the predicted first error rate.

(A8) In some embodiments of any of (A1)-(A7), each of the plurality of the MRAM cells comprises: a magnetic storage layer; and a magnetic reference layer. A datum is encoded in a relative alignment of a magnetization of the magnetic storage layer and the magnetic reference layer.

(A9) In some embodiments of (A8), each of the plurality of the MRAM cells comprises a current-induced magnetic switching device.

(A10) In some embodiments of any of (A8)-(A9), the first error rate corresponds to a thermal stability of the relative alignment of the magnetization of the magnetic storage layer and the magnetic reference layer.

(A11) In some embodiments of (A10), the thermal stability is proportional to the first magnetic anisotropy.

(A12) In some embodiments of (A11), the first magnetic anisotropy is a perpendicular magnetic anisotropy.

(A13) In some embodiments of any of (A10)-(A12), the thermal stability is proportional to a size of the MRAM cell.

BRIEF DESCRIPTION OF THE DRAWINGS

For a better understanding of the various described embodiments, reference should be made to the Detailed Description below, in conjunction with the following drawings in which like reference numerals refer to corresponding parts throughout the Figures.

FIGS. 2A-2B illustrate a flow chart of a method for error recovery in magnetic random access memory after reflow soldering, in accordance with some embodiments.

DETAILED DESCRIPTION

As noted above, it is often desirable to pre-load data, such as firmware, onto a chip before soldering the chip onto a larger device. However, the typical method of soldering on manufacturing scales, called reflow soldering, subjects the chip to harsh temperatures. In magnetic random access memory (MRAM), which encodes data via a relative orientation of magnetizations of two magnetic layers, these harsh temperatures lead to an elevated error rate corresponding to magnetic reversals of the bit. This error rate is well above what can be expected during normal operation and use.

One approach to increasing the robustness of data stored in MRAM to the reflow soldering process is to increase the magnetic anisotropy of magnetic layers used to store bits. Unfortunately, doing so increases the size of the MRAM device as well as the magnitude of the switching current (e.g., the current necessary to write a bit, by switching a magnetization of the MRAM device). This is not desirable due to current constraints from the underlying CMOS and the limited endurance resulting from such an increase in the switching current. Increasing the size of the MRAM device also lowers the density of memory. These undesirable side effects may be tolerated despite the fact that, after manufacturing, the MRAM device will never again be subjected to such harsh temperature conditions.

To address the problems of data retention and robustness during reflow soldering, some embodiments of the present disclosure pre-load spare memory in MRAM devices with extra error correcting data. The MRAM devices are then soldered (e.g., via solder reflow) onto a larger device. Afterward, the extra error correcting data is used to correct errors that accumulated during soldering, after which point the extra error correcting data can be erased (e.g., the MRAM device has also been pre-loaded with error correcting data sufficient for normal device operation and use). By storing extra error correcting data, the embodiments of the present disclosure obviate the need to increase the magnetic anisotropy of MRAM devices (or at least obviate the need to increase the magnetic anisotropy as much as would otherwise have been necessary without the extra error correcting data), avoiding the problems associated with increased switching current and size.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
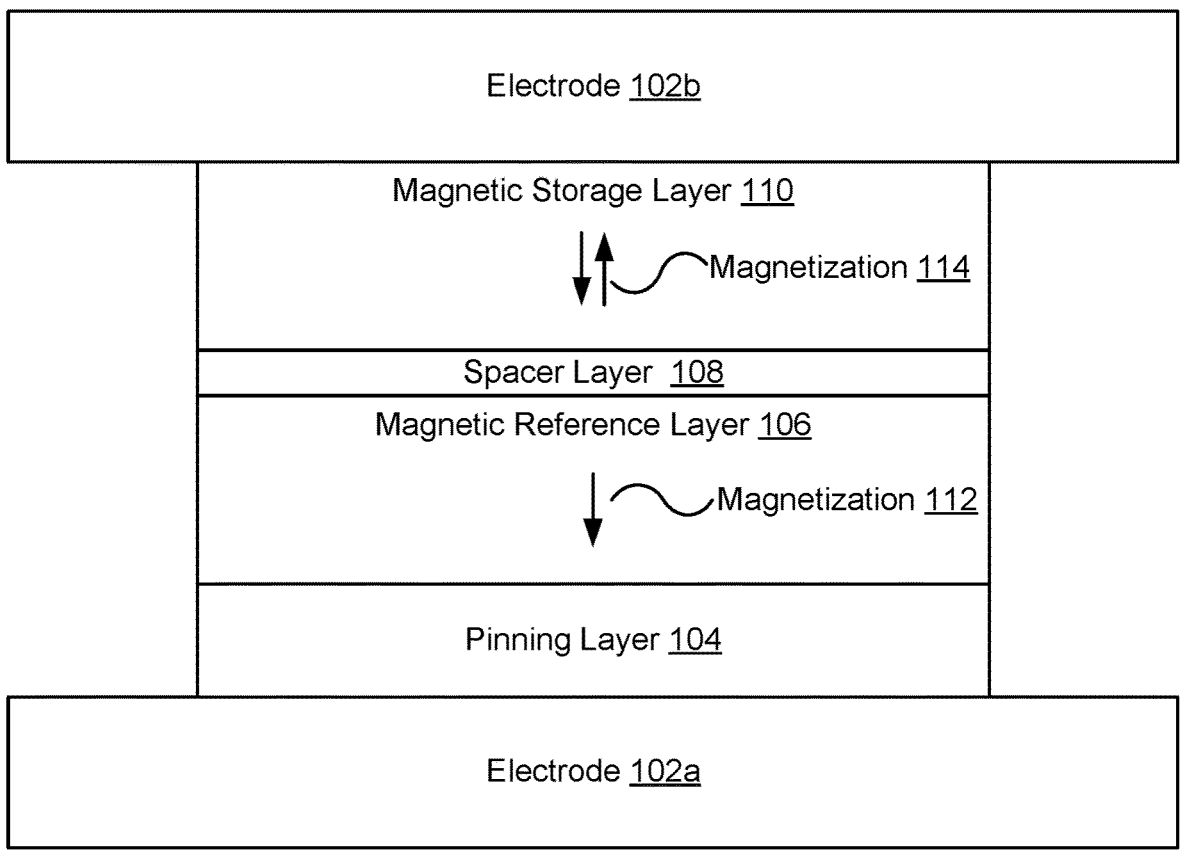
FIG. 1 illustrates an MRAM cell comprising a current-induced magnetic switching device, in accordance with some embodiments.

FIG. 1 illustrates an MRAM cell 100 comprising a current-induced magnetic switching device, in accordance with some embodiments. MRAM cell 100 includes electrodes 102 (e.g., bottom electrode 102a and top electrode 102b); a pinning layer 104; a magnetic reference layer 106; a spacer layer 108; and a magnetic storage layer 110. Note that MRAM cell 100 may include other layers that are not shown (e.g., sticking layers, additional spacer layers, and the like).

The magnetic reference layer 106 is also sometimes referred to as a pinned or fixed layer. The magnetic storage layer 110 is also sometimes referred to as a free layer. In some embodiments, the magnetic layers (e.g., the magnetic reference layer 106 and the magnetic storage layer 110) are comprised of thin (e.g., 0.5-10 nm) CoFeB with various compositions, such that Boron is typically between 10 to 40%. In some embodiments, the magnetic storage layer comprises a thin (e.g., less than 5 nm) CoFeB single layer or a composite layer. For example, in a composite layer, materials can be alternatively arranged to comprise the storage layer, such as using W (i.e., Tungsten) or Ta as insertion layers to change the magnetic anisotropy. The free layer can be a thin CoFeB (e.g., less than 5 nm) single layer or a composite layer by for instance using tungsten (W) or tantalum (Ta) insertion layers in other to further tailor the anisotropy.

In some embodiments, magnetic storage layer 110 and magnetic reference layer 106 are ferromagnetic. Thus, magnetic storage layer 110 has a magnetization 114 and magnetic reference layer 106 has a magnetization 112. Because of magnetic anisotropy, the respective magnetizations 112/114 tend to align with an "easy axis," which is the energetically favorable direction of spontaneous magnetization. For example, in some embodiments, the magnetic anisotropy is a perpendicular magnetic anisotropy and the favorable direction (e.g., the easy axis) is perpendicular to the plane of the layer. In such embodiments, the MRAM cell 100 is known as a perpendicular MRAM (pMRAM) cell.

As used herein, the term "magnetic anisotropy" refers to an energy required to rotate a magnetization from an easy direction into a hard direction.

The spacer layer 108 is also sometimes referred to as a barrier layer (or a tunnel barrier). In some implementations, the spacer layer 108 comprises an electrically-conductive material such as a metal. In some implementations, the spacer layer 108 comprises an electrically-insulating material such as magnesium oxide MgO. In some embodiments, the spacer layer 108 comprises Aluminum oxide ($Al_2O_3$) or $MgAl_2O_4$. When the spacer layer 108 comprises an electrically-insulating material, the MRAM cell 100 is known as a magnetic tunnel junction (MTJ).

A datum (e.g., a bit) is encoded in a relative alignment of the magnetization 114 of the magnetic storage layer 110 and the magnetization 112 of the magnetic reference layer 106. For example, when the magnetization 114 of the magnetic storage layer 110 is parallel to the magnetization 112 of the magnetic reference layer 106, the MRAM cell 100 may store a "0." In contrast, when the magnetization 114 of the magnetic storage layer 110 is anti-parallel to the magnetization 112 of the magnetic reference layer 106, the MRAM cell 100 may store a "1."

Due to the giant magnetoresistance (GMR) effect, MRAM cell 100 exhibits a readable change in the electrical resistance depending on the relative alignment of the magnetization 114 of the magnetic storage layer 110 and the magnetization 112 of the magnetic reference layer 106. Thus, MRAM cell 100 can be read by applying a small current between electrodes 102 in order to measure the resistance between the two electrodes 102.

As noted above, in some embodiments, MRAM cell 100 comprises a current-induced magnetic switching device, meaning that the datum (e.g., bit) is written by applying a write current between electrodes 102. The write current needs to be larger than a so-called switching current in order to reverse the magnetization of the magnetic storage layer 110. When a write current is applied, the write current is spin-polarized by the magnetization 112 of the magnetic reference layer 106. The spin polarized current then applies a "magnetic torque" to the magnetization 114 of the magnetic storage layer 110, which can act to reverse the magnetization 114 of the magnetic storage layer 110 and thus change the relative alignment of the magnetization 114 of the magnetic storage layer 110 and the magnetization 112 of the magnetic reference layer 106.

The pinning layer 104 fixes the magnetization 112 of the magnetic reference layer 106. Thus, only the magnetization 114 of the magnetic storage layer 110 changes (switches or flips) when a write current is applied. The magnetization 112 of the magnetic reference layer 106 does not change when a write current is applied. To that end, in some embodiments, the pinning layer 104 is anti-ferromagnetically coupled (e.g., either in direct contact with or is coupled using a thin Ta or W spacer, e.g., less than 1 nm thick) to the magnetic reference layer 106. In some embodiments, the pinning layer 104 is a synthetic anti-ferromagnet comprised of multilayers of cobalt (Co) and platinum (Pt) coupled in an antiferromagnetic fashion by a thin layer of Ru.

When the magnetic layers 106/110 of MRAM cell 100 exhibit a perpendicular magnetic anisotropy, the critical switching current required to switch from the parallel to anti-parallel configuration ($I_C^{P \to AP}$) is given by:

$$I_C^{P \to AP} \propto \frac{M \times V}{p_P}(H_{ext} \pm H_{dip} + H_A) \quad (1)$$

where M is the magnetization (e.g., saturation magnetization) per unit volume V of the magnetic storage layer 110; $p_P$ is the polarization of the write current in the parallel state ($p_{AP}$, below, is the polarization of the write current in the anti-parallel state); $H_{ext}$ is an applied magnetic field, which can be positive or negative, where positive is taken as the direction of the magnetization of the pinned layer; $H_{dip}$ is a dipole field from the magnetic storage layer 110 (e.g., $H_{dip}$ is negative if the pinned layer and the free layer are anti-ferromagnetically coupled); and $H_A$ is an effective anisotropy field due to the magnetic anisotropy (where $H_A > H_{dip}$).

The critical current required to switch from the anti-parallel to parallel configuration ($I_C^{AP \to P}$) is different due to assistance of the dipole field $H_{dip}$ in one case and the hindrance in the other as well as the different values of the current spin polarization in the parallel and antiparallel states (e.g., $p_P$ versus $p_{AP}$). Note that, in the parallel configuration (i.e., switching from parallel to antiparallel), the spin-polarized electrons that switch the magnetic storage layer 110 are generated by spin-preferential reflection from the magnetic reference layer 106, whereas in the anti-parallel configuration, the spin-polarized electrons that switch the magnetic storage layer 110 are generated by spin-preferential transmission through the magnetic reference layer 106, which is typically a more efficient process. Thus, the critical switching current required to switch from the anti-parallel to parallel configuration ($I_C^{AP \to P}$) is given by:

$$I_C^{AP \to P} \propto \frac{M \times V}{p_{AP}}(H_{ext} \pm H_{dip} - H_A) \quad (2)$$

Assuming that no external field $H_{ext}$ is applied, and ignoring the dipole field $H_{dip}$, it can be seen that the critical current $I_C$ is proportional to the magnetic anisotropy $E_A$.

$$E_A = \tfrac{1}{2}(M \times V \times H_A) \quad (3)$$

Similarly, the thermal stability of MRAM cell 100 is proportional to the magnetic anisotropy $E_A$. That is, the average lifetime τ of a datum (before the magnetization will spontaneously reverse) is thus given by:

$$\tau = \tau_0 e^{\frac{E_A}{k_B T}} \quad (4)$$

where $k_B$ is the Boltzmann constant; and T is temperature; and $\tau_0$ is a constant. This average lifetime τ gives rise to an error rate (e.g., a retention error rate) corresponding to the thermal stability of the relative alignment of the magnetization of the magnetic storage layer 110 and the magnetic reference layer 106. (In some embodiments, the error rate is the inverse of the average lifetime τ.) Thus, if $H_A$ is increased a written bit will last longer and be more robust to increased temperature, but the writing of the bit becomes increasingly difficult (e.g., requires a higher write current).

One approach to increasing the robustness of data stored in MRAM to the reflow soldering process (e.g., increasing data retention during the reflow soldering process) is to increase the magnetic anisotropy $E_A$. This means either increasing the volume V of the free layer (e.g., the diameter and/or thickness of the free layer), increasing the effective anisotropy field $H_A$, or the magnetization per unit volume M of the magnetic storage layer 110. Barring a corresponding increase in switching efficiency (e.g., via an increased spin polarization p), increasing the magnetic anisotropy $E_A$ would lead to an increase in the switching current $I_C$. Increasing the switching current $I_C$ is not a desirable due to the current constraints from the underlying CMOS or due to the limited endurance resulting from such an increase in switching current. Increasing the volume M of the magnetic storage layer 110 also increases the size of the MRAM cell 100, thus lowering the density of memory.

Figure 2B:
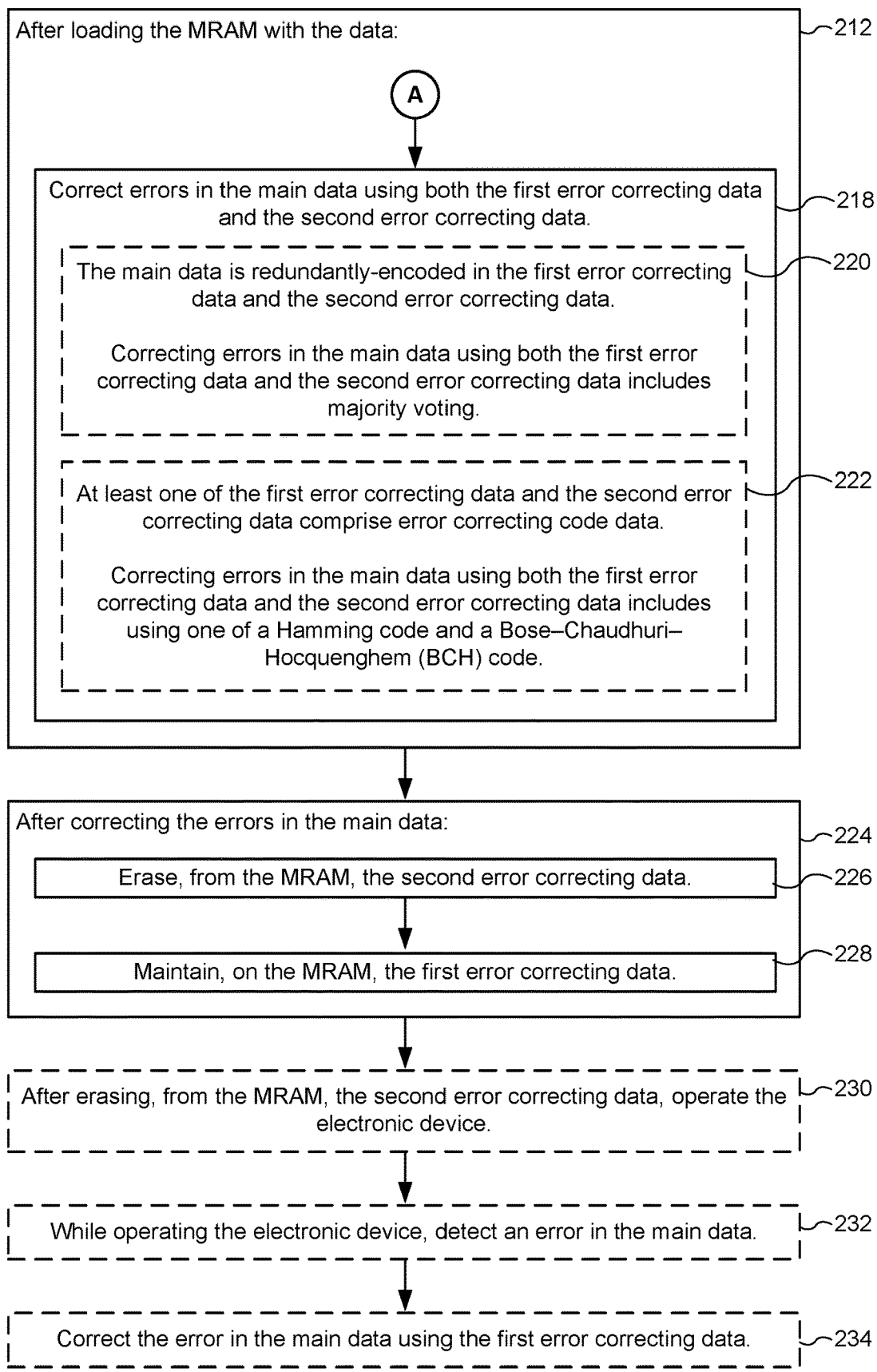

Method 200, described below with reference to FIGS. 2A-2B, provides an alternative in which memory in MRAM devices is pre-loaded with extra error correcting data before soldering (e.g., via solder reflow) onto a larger device. Afterward, the extra error correcting data is used to correct errors that accumulated during soldering, at which point the extra error correcting data can be erased (e.g., the MRAM device has also been pre-loaded with error correcting data sufficient for normal device operation and use). By storing extra error correcting data, method 200 obviates the need to increase the magnetic anisotropy $H_A$ of MRAM devices (or at least obviate the need to increase the magnetic anisotropy as much as would otherwise have been necessary without the extra error correcting data), avoiding the problems associated with increased switching current $I_C$ and size.

FIGS. 2A-2B illustrate a flow chart of a method 200 for error recovery in magnetic random access memory after reflow soldering, in accordance with some embodiments. In some embodiments, some operations of method 200 are performed at an electronic device that includes magnetic random access memory (MRAM) (e.g., comprising MRAM cells 100, FIG. 1). In some embodiments, method 200 is used to assemble or manufacture the electronic device (e.g., electronic device 300, FIGS. 3A-3B).

The method 200 includes loading (202) MRAM with data including main data, first error correcting data, and second error correcting data. In some embodiments, loading the MRAM with the data comprises pre-loading the MRAM with the data before heating the electronic device (e.g., in a reflow soldering process). The MRAM comprises a plurality of MRAM cells characterized by a first magnetic anisotropy corresponding to a first error rate at a predefined temperature (e.g., MRAM cell 100, FIG. 1). The first error rate exceeds a threshold for correcting errors using only the first error correcting data. In some embodiments, the threshold corresponds to a number of errors that can be corrected using only the first error correcting data. In some embodiments, the first magnetic anisotropy corresponds to a first number of errors when subjected to a predefined time-temperature profile (e.g., used for reflow soldering). The first number of errors is uncorrectable using only the first error correcting data (e.g., exceeds the threshold for correcting errors using only the first error correcting data). Note that the threshold for correcting errors using only the first error correcting data can be considered a threshold rate (e.g. a tolerable rate of errors that occur during the predefined time-temperature profile) or a threshold number (e.g., a tolerable total number of errors that occur over the entirety of the predefined time-temperature profile). In some embodiments, the first number of errors is correctable using both the first error correcting data and the second error correcting data.

In some embodiments, the main data comprises (204) firmware for the device. In some embodiments, the firmware comprises code. In some embodiments, the firmware comprises one or more programs for the operation (e.g., normal operation) of the electronic device (e.g., an operating system of the electronic device).

In some embodiments, the errors are retention errors and the first error rate is a retention error rate. Retention errors occur when the memory does not retain (e.g., loses) the data that has been written to it (e.g., spontaneously). For example, retention errors occur in MRAM when a magnetization of a storage layer spontaneously reverses, as discussed above with reference to Equations (3)-(4). Depending on the characteristics of the MRAM and the solder reflow time-temperature profile, the probability that the data is retained correctly can be determined. For example, in some embodiments, the method 200 comprises predicting the first error rate based on the predefined temperature and allocating an amount of second error correcting data based on the predicted first error rate. For example, using Equations (3)-(4) above, error rates during the predefined time-temperature profile (e.g., used for reflow soldering) can be determined. The error rates can be integrated over time for the reflow soldering process to calculate the first number of errors.

In some embodiments, each of the plurality of the MRAM cells comprises (206) a magnetic storage layer and a magnetic reference layer (e.g., as discussed with reference to FIG. 1, above). A datum is encoded in a relative alignment of a magnetization of the magnetic storage layer and the magnetic reference layer. In some embodiments, each of the plurality of the MRAM cells comprises (208) a current-induced magnetic switching device. That is, the MRAM cells are written by a write current applied across each MRAM cell (e.g., rather than an applied external magnetic field). In some embodiments, the MRAM cells are magnetic tunnel junctions (MTJs). In some embodiments, the MRAM cells have one or more layers exhibiting a perpendicular magnetic anisotropy (e.g., the first magnetic anisotropy is a perpendicular magnetic anisotropy).

As discussed with reference to Equations (3)-(4) above, in some embodiments, the first error rate corresponds (210) to a thermal stability of the relative alignment of the magnetization of the magnetic storage layer and the magnetic reference layer. In some embodiments, the thermal stability is proportional to the first magnetic anisotropy. In some embodiments, the thermal stability is proportional to a size (e.g., volume) of the MRAM cell. For example, the thermal stability is proportional to a square of a radius of the MRAM cell. In some embodiments, the thermal stability is proportional to a thickness of the MRAM cell. The thermal stability is also proportional to other factors, such as the value of the magnetization of the magnetic storage layer.

The method 200 further includes, after loading the MRAM with the data (212), heating (214) the MRAM to the predefined temperature. In some embodiments, heating the MRAM includes applying a predefined time-temperature profile to the MRAM, where the predefined time-temperature profile corresponds to (e.g., gives rise to) the first number of errors (e.g., through thermal switching of the magnetization 114 of the magnetic storage layer 110). In some embodiments, the MRAM is heated (216) to the predefined temperature during a solder reflow process. It should be understood, however, that method 200 is equally applicable to any other process (e.g., manufacturing process) in which data (e.g., firmware) is pre-loaded onto a chip before the chip is subjected to elevated temperatures.

The method 200 further includes, after loading the MRAM with the data, correcting (218) errors in the main data using both the first error correcting data and the second error correcting data (e.g., correcting errors that would be uncorrectable using only the first error correcting data).

In some embodiments, the main data is (220) redundantly-encoded in the first error correcting data and the second error correcting data. Correcting errors in the main data using both the first error correcting data and the second error correcting data includes majority voting. Majority voting is particularly well-suited for MRAM, since MRAM is stochastic in nature. That is, because the thermal switching process described above flips bits in either direction with an equal probability, the majority value of a redundantly-encoded bit is likely to be preserved during thermal treatment.

In some embodiments, at least one of the first error correcting data and the second error correcting data comprise (222) error correcting code data. Correcting errors in the main data using both the first error correcting data and the second error correcting data includes using one of a Hamming code and a Bose-Chaudhuri-Hocquenghem (BCH) code.

The method 200 further includes, after correcting the errors in the main data (224): erasing (226), from the MRAM, the second error correcting data and maintaining (228), on the MRAM, the first error correcting data. Thus, the extra error correcting data (e.g., the second error correcting data) is erased to allow the MRAM to operate at full capacity during normal use.

In some embodiments, the method 200 includes, after erasing, from the MRAM, the second error correcting data, operating (230) the electronic device. In some embodiments, the method 200 further includes, while operating the electronic device, detecting (232) an error in the main data and correcting (234) the error in the main data using the first error correcting data (e.g., only the first error correcting data). In some embodiments, method 200 includes predicting the second error rate corresponding to normal operation of the electronic device (e.g., normal operating temperatures) and allocating an amount of the first error correcting data based on the predicted second error rate (e.g., the first error correcting data is sufficient to correct errors that occur during normal intended use).

Figure 3A:
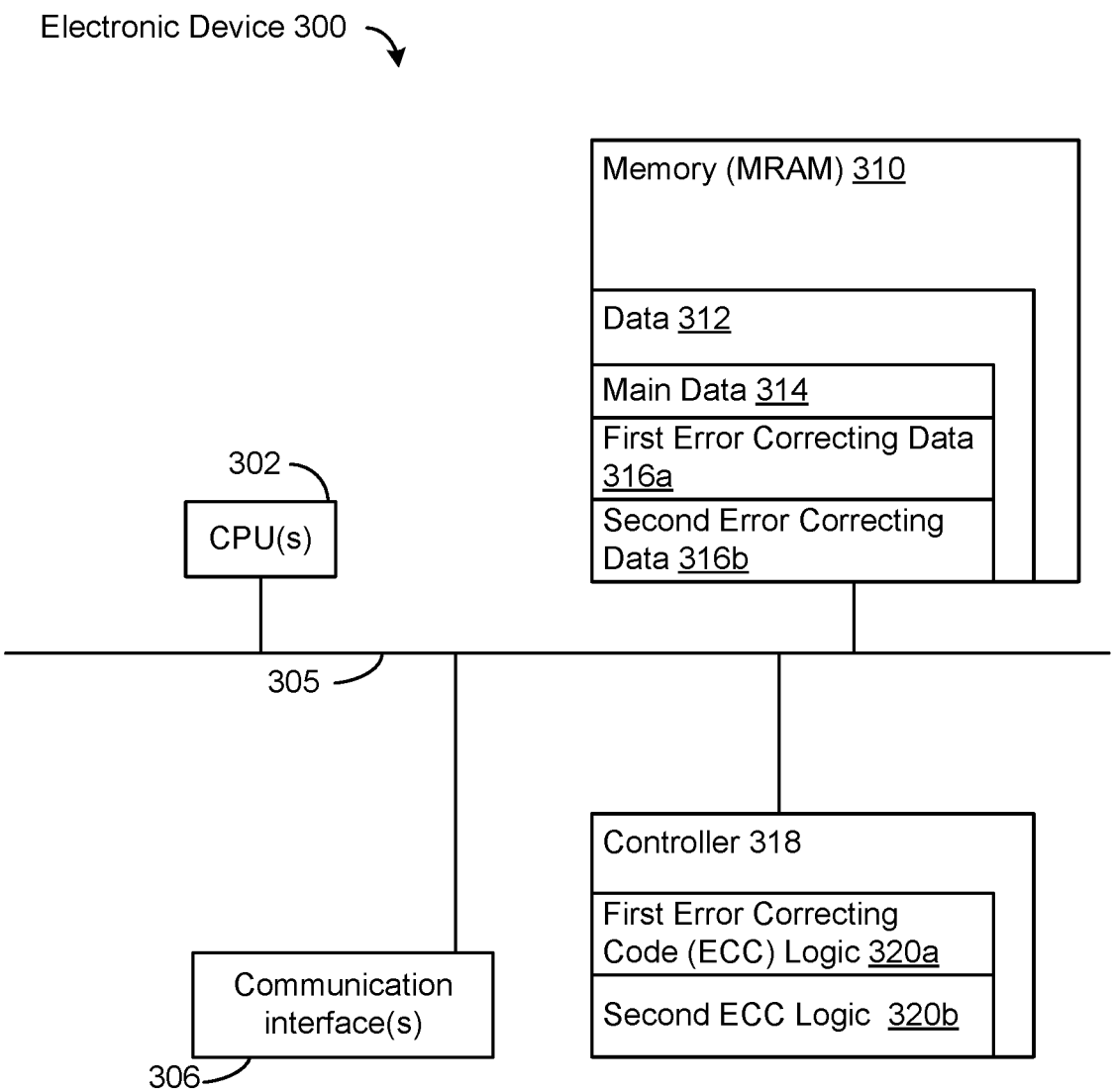
FIG. 3A illustrates an electronic device with extra error correction data for use following a reflow soldering process, in accordance with some embodiments.
Figure 3B:
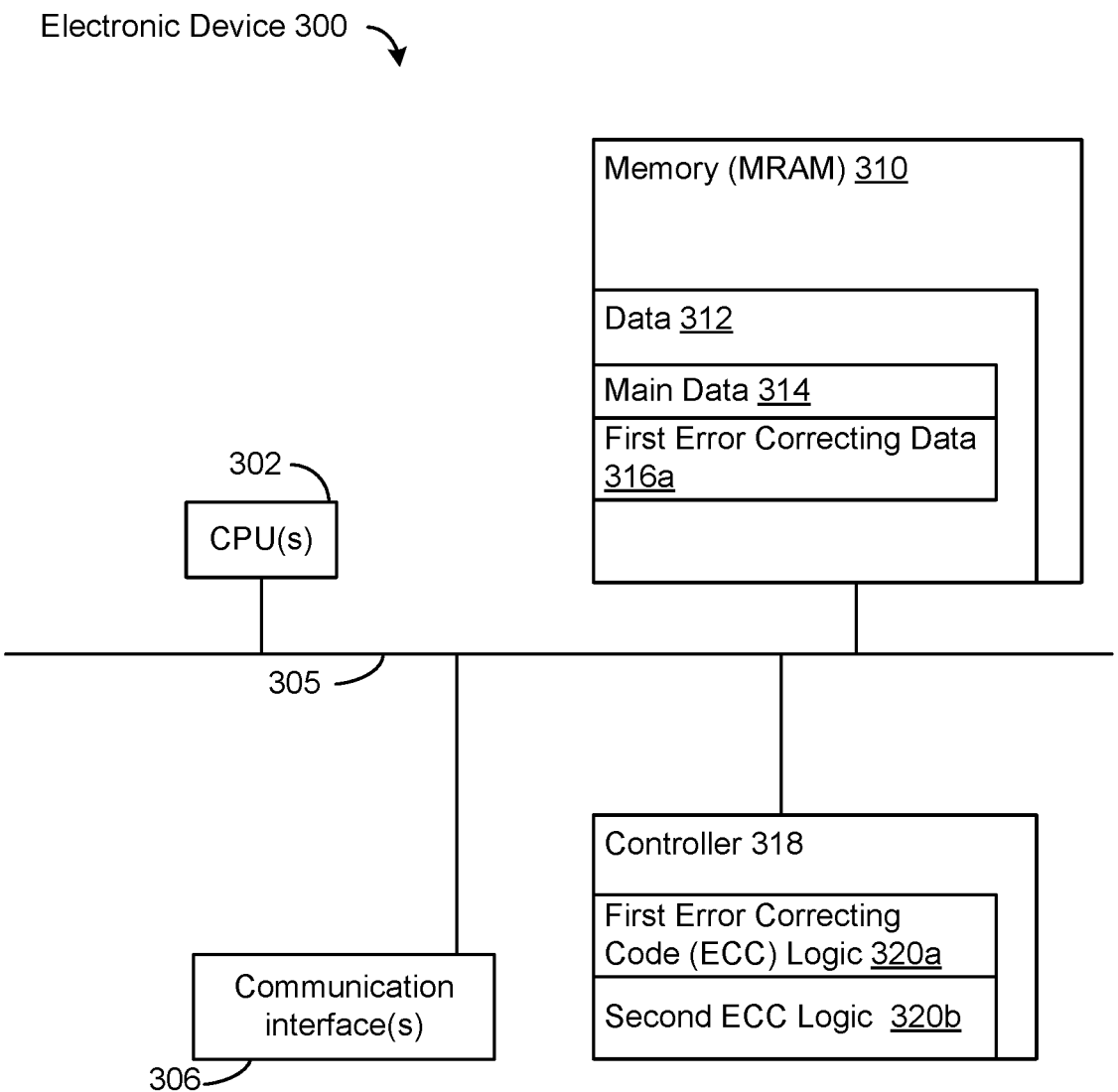
FIG. 3B illustrates the electronic device shown in FIG. 3A with the extra error correction data erased, in accordance with some embodiments.

FIG. 3A illustrates an electronic device 300 with extra error correction data (e.g., second error correcting data 316b) for use following a reflow soldering process, in accordance with some embodiments. In some embodiments, FIG. 3A illustrates a snapshot of electronic device 300 after solder reflow, whereas FIG. 3B illustrates the electronic device shown in FIG. 3A with the extra error correction data erased (e.g., in normal operation and use).

Electronic device 300 typically includes one or more processors (sometimes called CPUs) 302 for executing programs or instructions; memory 310 (e.g., MRAM); controller 318 (e.g., a memory controller); one or more communications interfaces 306; and one or more communication buses 305 for interconnecting these components. Electronic device 300 optionally includes a user interface comprising a display device and one or more input devices (e.g., one or more of a keyboard, mouse, touch screen, keypad, etc.) coupled to other components of electronic device 300 by the one or more communication buses 305. The one or more communication buses 305 may include circuitry (sometimes called a chipset) that interconnects and controls communications between system components.

Communication interface 306 is used by electronic device 300 to convey information to external systems, and to receive communications from external systems, such as external database. The communications interface 306 may be adapted to use a communication network such as the internet or a public or proprietary wireless network.

Memory 310 includes magnetic random access memory. In some embodiments, memory 310 may include other forms of memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 310 optionally includes one or more storage devices remotely located from the CPU(s) 302. Memory 310, or alternately the non-volatile memory device(s) within memory 310, comprises a computer readable storage medium. In some embodiments, memory 310 or the computer readable storage medium of memory 310 stores data 312, which may include the following programs, modules and data structures, or a subset thereof:
- main data 314 (e.g., firmware, such as an operating system for the electronic device 300);
- first error correcting data 316a (e.g., which may comprise redundant encoding of the main data 314 or data used for error correcting codes such as a Hamming code or a BCH code); and
- second error correcting data 316b (e.g., which may comprise extra redundant encoding of the main data 314 or extra data used for error correcting codes such as a Hamming code or a BCH code).
- controller code 318, which may include first error correcting code (ECC) logic 320a (e.g., one or more programs for correcting error in the main data 314 using only the first error correcting data 316a) and second error correcting code (ECC) logic 320b (e.g., one or more programs for correcting error in the main data 314 using both the first error correcting data 316a and the second error correcting data 316b).

Controller 318 includes first error correcting code (ECC) logic 320a and, if necessary, second ECC logic 320b. In some embodiments, first ECC logic 320a corrects errors in the main data 314 using the first error correcting data 316a. Second ECC logic 320b corrects errors in the main data 314 using both the first error correcting data 316a and the second error correcting data 316b. One of skill in the art, however, will recognize that in some circumstances, first ECC logic 320a and second ECC logic 320b may be combined. Further, one of skill in the art will recognize various ways to implement first ECC logic 320a and second ECC logic 320b. For example, in some embodiments, first ECC logic 320a and second ECC logic 320b are implemented as hardware. In some embodiments, first ECC logic 320a and second ECC logic 320b are implemented as software Each of the above identified modules and applications correspond to a set of instructions for performing a function described above. The set of instructions can be executed by the one or more processors 302 of electronic device 300. The above identified modules, applications or programs (i.e., sets of instructions) need not be implemented as separate programs, procedures or modules, and thus various subsets of these modules may be combined or otherwise re-arranged in various embodiments. In some embodiments, memory 310 stores a subset of the modules and data structures identified above. Furthermore, memory 310 optionally stores additional modules and data structures not described above.

FIGS. 3A-3B are intended more as a functional description of the various features which may be present in an electronic device 300 than as a structural schematic of the embodiments described herein. In practice, and as recognized by those of ordinary skill in the art, items shown separately could be combined and some items could be separated. For example, some items shown separately in FIGS. 3A-3B could be combined into a single module or component, and single items could be implemented using two or more modules or components. The actual number of modules and components, and how features are allocated among them will vary from one implementation to another.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc., are, in some instances, used herein to describe various elements, these elements should not be limited by these terms. These terms are only used to distinguish one element from another. For example, a first widget could be termed a second widget, and, similarly, a second widget could be termed a first widget, without departing from the scope of the various described embodiments. The first switch and the second widgets are both widgets, but they are not the same widget unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of manufacturing an electronic device that includes magnetic random access memory (MRAM), comprising:
    loading the MRAM with data including main data, first error correcting data, and second error correcting data, wherein:
        the MRAM comprises a plurality of MRAM cells characterized by a first magnetic anisotropy corresponding to a first error rate at a predefined temperature; and the first error rate exceeds a threshold for correcting errors using only the first error correcting data;

after loading the MRAM with the data:
  heating the MRAM to the predefined temperature;
  correcting errors in the main data using both the first error correcting data and the second error correcting data;

after correcting the errors in the main data:
  erasing, from the MRAM, the second error correcting data; and
  maintaining, on the MRAM, the first error correcting data.

2. The method of claim 1, further including:
after erasing, from the MRAM, the second error correcting data, operating the electronic device;
while operating the electronic device, detecting an error in the main data; and
correcting the error in the main data using the first error correcting data.

3. The method of claim 1, wherein the MRAM is heated to the predefined temperature during a reflow soldering process.

4. The method of claim 1, wherein the main data comprises firmware for the device.

5. The method of claim 1, wherein:
the main data is redundantly-encoded in the first error correcting data and the second error correcting data; and
correcting errors in the main data using both the first error correcting data and the second error correcting data includes majority voting.

6. The method of claim 1, wherein:
at least one of the first error correcting data and the second error correcting data comprise error correcting code data; and
correcting errors in the main data using both the first error correcting data and the second error correcting data includes using one of a Hamming code and a Bose-Chaudhuri-Hocquenghem (BCH) code.

7. The method of claim 1, further including:
predicting the first error rate based on the predefined temperature; and
allocating an amount of second error correcting data based on the predicted first error rate.

8. The method of claim 1, wherein each of the plurality of the MRAM cells comprises:
a magnetic storage layer; and
a magnetic reference layer;
wherein a datum is encoded in a relative alignment of a magnetization of the magnetic storage layer and the magnetic reference layer.

9. The method of claim 8, wherein each of the plurality of the MRAM cells comprises a current-induced magnetic switching device.

10. The method of claim 8, wherein the first error rate corresponds to a thermal stability of the relative alignment of the magnetization of the magnetic storage layer and the magnetic reference layer.

11. The method of claim 10, wherein the thermal stability is proportional to the first magnetic anisotropy.

12. The method of claim 11, wherein the first magnetic anisotropy is a perpendicular magnetic anisotropy.

13. The method of claim 10, wherein the thermal stability is proportional to a size of the MRAM cell.

* * * * *